(12) United States Patent
Lauterbach et al.

(10) Patent No.: US 6,833,731 B1
(45) Date of Patent: Dec. 21, 2004

(54) ELECTRONIC CIRCUIT FOR A METHOD FOR STORING INFORMATION, SAID CIRCUIT COMPRISING FERROELECTRIC FLIP-FLOPS

(75) Inventors: Christl Lauterbach, Hoehenkirchen-Siegertsbr (DE); Georg Braun, Munich (DE); Udo Ollert, Kirchweidach (DE); Werner Weber, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/070,025
(22) PCT Filed: May 18, 2000
(86) PCT No.: PCT/DE00/01607

§ 371 (c)(1),
(2), (4) Date: May 14, 2002

(87) PCT Pub. No.: WO01/15323
PCT Pub. Date: Mar. 1, 2001

(30) Foreign Application Priority Data

Aug. 25, 1999 (DE) .......................................... 199 40 355

(51) Int. Cl.$^7$ .............................................. H03K 19/00
(52) U.S. Cl. .......................................... 326/46; 326/95
(58) Field of Search .............................. 326/46, 38, 95, 326/98; 327/215, 217, 218

(56) References Cited

U.S. PATENT DOCUMENTS

| | | | |
|---|---|---|---|
| 4,140,013 A | * | 2/1979 | Hunger |
| 5,361,224 A | * | 11/1994 | Takasu |
| 5,923,184 A | * | 7/1999 | Ooms et al. |

FOREIGN PATENT DOCUMENTS

| | | | |
|---|---|---|---|
| DE | 2847066 A1 | * | 5/1980 |
| DE | 3886600 T2 | * | 7/1994 |
| EP | 0 549 519 | * | 6/1999 |

OTHER PUBLICATIONS

Seitz C L et al: "Hot–Clock NMOS" Chapel Hill Conference on VLSI, XX, XX, 1985, pp. 1–17, XP000603352.
Fuseless Non–Volatile Ferroelectric Redundant Word and Bit Decorder IBM Technical Disclosure Bulletin, US, IBM Corp. New York, vol. 34, No. 7B, Dec. 1, 1991, pp. 138–140, XP000282528, ISSN: 0018–8689.

* cited by examiner

*Primary Examiner*—Daniel Chang
(74) *Attorney, Agent, or Firm*—Altera Law Group, LLC; Jeffrey R. Stone (57) ABSTRACT

A supply voltage is needed in conventional electronic circuits used for processing signals, such as counting pulses. The supply voltage supplies the logic circuit components. Especially apparatuses which have to be operated over a longer period of time or/and in remote sites of use and are dependent upon a supply voltage are impaired with the dependency-related disadvantages, such as the necessity of expensive EEPROMs or significantly increased maintenance expenditure. The present invention relates to an electronic circuit which is provided with an input (5) for inputting at least one information signal, an energy means (2) for converting the energy that is present in the at least one information signal into a supply voltage, a control means (3) for generating at least one switch-on control signal when the information signal is input and a signal processing means (4) for storing information which is represented by the at least one information signal and/or for evaluating information which is represented by the at least one information signal and for storing the secondary information which is obtained by the evaluation. At least one ferroelectric flipflop (26) is used. The signal processing means (4) can be activated by the at least one switch-on control signal for evaluating and/or storing purposes. The at least one information signal can be or is the only energy source for the electronic circuit (1) during the evaluation and/or storing process.

19 Claims, 7 Drawing Sheets

ELECTRONIC CIRCUIT FOR A METHOD FOR STORING INFORMATION, SAID CIRCUIT COMPRISING FERROELECTRIC FLIP-FLOPS

The present invention relates to electronic circuits with ferroelectric flip-flops which can use arriving signals as the sole energy source, a liquid counter based on such an electronic circuit, a method for storing information contained in signals, and also the use of ferroelectric flip-flops for electronic circuits.

In conventional electronic circuits for processing signals, for example counting pulses, a supply voltage is required which supplies the logic modules. This supply voltage is supplied for example by a battery, such as a lithium battery. A battery considerably increases the production and operating costs of an apparatus which uses the circuit, and, moreover, has to be replaced at regular intervals. If results of a signal evaluation are to remain stored even when the operating voltage fails, a nonvolatile memory, for example EEPROM or FLASH-EPROM, is additionally required. Such electrically erasable memory cells require high voltages of minus 12 and plus 16 volts, respectively, for programming and for erasing, which have to be generated from the battery voltage by charge pumps. The relatively poor efficiency in high-voltage generation leads to a high power loss. Furthermore, EEPROM memories have a service life which is limited by the number of reprogramming processes. This is disadvantageous particularly in the case of counting circuits, where the so-called "Least Significant Bit" (the bit which is least significant or the smallest position of the counter) has to be reprogrammed for each counting pulse that arrives.

Particularly in the case of apparatuses which are intended to be in operation over relatively long periods of time and/or at remote sites of use, the dependence on a supply voltage leads, moreover, to a significantly increased outlay on maintenance, since maintenance personnel have to go to the apparatuses especially for the purpose of exchanging the battery or monitoring the battery.

The use of a supply voltage generated from the electricity supply system is likewise associated with a high outlay and, in the case of remote sites, is in some instances not practicable at all. In the event of system failures, moreover, it may lead to incorrect counting results.

On account of the abovementioned disadvantages, however, there is a need to realize circuits which can operate as far as possible independently of the various voltage supplies mentioned above.

Consequently, the present invention is based on the object of providing a signal-processing and/or information-storing circuit which can be operated autonomously of external power supplies.

The present invention achieves this object by the provision of an electronic circuit in accordance with the independent patent claim 1, a method for information storage in accordance with the independent patent claim 16, the use of ferroelectric flip-flops for electronic circuits in accordance with the independent patent claim 22, and the liquid counter in accordance with the independent patent claim 26. Further advantageous configurations, details and aspects of the present invention emerge from the dependent patent Claims, the description and the accompanying drawings.

In the analysis of signal-processing circuits and the signal-generating sensors assigned thereto, it has now been found that although the energy inherent in the signals does not suffice to be able to operate EEPROM memories, this energy nonetheless still amounts to 30 nJ in the case of a typical pulse wire sensor. It has unexpectedly been found that this quantity of energy suffices to operate circuits if special flip-flops with implemented ferroelectric storage capacitances, so-called ferro-flip-flops, are used.

The present invention is therefore directed at an electronic circuit, having an input for inputting at least one information signal; an energy means for converting energy contained in the at least one information signal into a voltage supply; a control means for generating at least one switch-on control signal when an information signal arrives; and a signal processing means for storing an information item represented by the at least one information signal and/or for evaluating an information item represented by the at least one information signal and storing the secondary information obtained through the evaluation by means of at least one ferroelectric flip-flop;

wherein the signal processing means can be activated by the at least one switch-on control signal for the purpose of evaluation and/or storage;

and wherein, during the evaluation and/or storage, the at least one information signal may be or is the sole energy source for the electronic circuit.

The electronic circuit according to the invention can thus also be provided with an external voltage supply. What is crucial, however, is that it does not rely on the latter for the information signal acquisition operation. Even in the event of a power failure, the electronic circuit according to the invention can continue to carry out its function. With regard to the power supply, the electronic circuit can thus be understood as a fail safe circuit. In particular embodiments and particularly preferred embodiments of the present invention, however, the electronic circuit is not actually provided with an external power supply, in so far as the latter is not connected for the readout of the stored information.

The ferroelectric flip-flops used according to the invention will be described in detail further below. In principle, they have the same structure as conventional flip-flops, that is to say they have, in particular a SET and a RESET input, and also a QB and Q output and NAND or NOR gates for the circuit logic. However, they are additionally provided with ferroelectric capacitors which enable them to store the logic state of the flip-flop when the voltage supply is disconnected and to reestablish the stored state when the voltage supply is switched on. For storing or reestablishing the state of the ferroelectric flip-flop, control signals are given in a temporally exact defined sequence (see below). Nonvolatile memories based on ferroelectric capacitors can be operated at low voltages and require only about a hundredth of the energy of EEPROM memories. In the case of the electronic circuit according to the invention, therefore, it is possible for the energy (10 nJ to 100 nJ) required for operating a customary circuit to be drawn solely from the arriving pulse or the arriving pulses.

Thus, according to the invention, the control means must be able to generate one or more control signals in a temporally controlled sequence and feed them to the signal processing means. This aim can be achieved in a simple manner using circuits and methods, respectively, known to persons skilled in the art. By way of example, different temporally staggered signals can be achieved by means of a bandgap difference circuit with a comparator circuit.

In the sense of the present invention, evaluation is to be understood as any interpretation of an information signal that has arrived by the signal processing means, for example the ascertainment of a time interval with respect to a preceding information signal, the logical combination via AND, OR, NAND, and NOR of different information signals, the counting up and down of information signals that arrive successively, and the toggling between on and off for successive arrivals of information signals, and any other conceivable interpretation of arriving information signals. In the sense of the present invention, a represented information item is to be understood to be any meaning which can be attributed to the input of an information signal in the temporal progression in its specific instance and in its relationship with other information signals.

The arriving information signals may have been generated by a customary sensor, for example. These are preferably sensors which generate a signal with a suitable voltage and with a sufficient energy content to be able to operate the circuit according to the invention. By way of example, inductive or piezoelectric sensors can be used. One possibility for a sensor that can be used is a pulse wire sensor, in which an external magnetic field, for example from a rotor provided with magnets, acts on a composite wire and generates therein an electrical pulse which is then available as information signal. In this case, the entire energy that is required is drawn from the magnetic field, so that an external energy supply is also not necessary for the sensor.

The electronic circuit according to the invention is preferably characterized in that the control means can generate at least one switch-off control signal after a predetermined time has elapsed after the at least one information signal arrives and/or when the energy converted from the at least one information signal is exhausted, wherein the signal processing means can be caused or is caused to effect a storage and to effect deactivation by the at least one switch-off control signal.

It is understood that a switch-off control signal is to be generated after time has elapsed only when, after the arrival of an information signal, no further information signal has arrived. The elapsing of a predetermined time thus always relates to the elapsing after the inputting of the last information signal, if a plurality of information signals have arrived successively. If the switch-off control signal is generated when the existing energy is exhausted, it is necessary to provide a circuit in the control means which can reliably ascertain that said energy is exhausted. By way of example, it is possible to use a circuit which can detect a possible voltage drop.

Preferably, the information stored in the at least one ferroelectric flip-flop can be converted into at least one output signal by the signal processing means, wherein in this case the electronic circuit furthermore has at least one output for outputting the at least one output signal. In this way, the information stored in the circuit can be read out again by a suitable read-out means.

The electronic circuit may furthermore have a display means for displaying the information stored in the at least one ferroelectric flip-flop. Such an additional display means is possible when sufficient energy for operating it can be obtained from the information signal. A display means enables the information stored in the at least one flip-flop to be read at any time.

Preferably, the display means is concomitantly supplied by the voltage supply generated by the energy means. However, it is also possible to configure the display means in such a way that it requires an external voltage supply. In this case, with autonomous operation of the electronic circuit, before the reading of the display means, an external voltage supply must first be connected. If the electronic circuit has an external voltage supply anyway, for example in the case of the above-described area of use of fail-safe circuits, such an external connection will generally not be necessary.

In order to keep the energy consumption of the display means as low as possible, an LCD display will preferably display the information. However, it is also possible to use other displays if they have a sufficiently low energy consumption. In order to ensure a coordinated transfer of information contained in the ferroelectric capacitors of the ferroelectric flip-flops to the logic gates of the ferroelectric flip-flop, the switch-on control signal preferably has the following signals:

an activation signal for activating precharge transistors of the at least one ferroelectric flip-flop; a transfer signal for transferring the information contained in ferroelectric capacitors of the at least one ferroelectric flip-flop onto internal data lines of the at least one ferroelectric flip-flop; and a current switching signal for switching on the voltage supply of the signal processing means.

In order to ensure that the information contained in the at least one ferroelectric flip-flop is written back in the event of a voltage drop, the switch-off control signal preferably has the following signals:

a transfer end signal;

an activation signal for activating precharge transistors of the at least one ferroelectric flip-flop; and a current switch-off signal for switching off the voltage supply of the signal processing means.

These different signals are transferred from the control means to the signal processing means preferably by virtue of the fact that signal lines for each of the switch-on signals and switch-off signals lead from the control means to the signal processing means. By way of example, moreover, for the transfer signal and the transfer end signal, a common transfer signal line may lead from the control means to the signal processing means, in which case the transfer signal may consist in the application of a voltage to the common transfer signal line and the transfer end signal may consist in the disconnection of the voltage on the common transfer signal line.

Equally, for the current switching signal and current switch-off signal, a common current signal line may lead from the control means to the signal processing means, wherein the current switching signal consists in the application of a voltage to the common current signal line and the current switch-off signal consists in the disconnection of the voltage on the common current signal line.

Since it is generally very easy to realize counting circuits using flip-flops, it is a preferred embodiment of the present invention that the signal processing circuit is a counting circuit for evaluating a plurality of information signals, which arrive successively or simultaneously, by counting the information signals that have arrived. In this case, it is thus possible for one or more information signal lines to be served simultaneously, provided that the circuit is able to do this. What is then involved is an input signal bus.

The counting circuit comprises, for example, a plurality of cascaded edge-controlled ferroelectric flip-flops, in which the at least one information signal is input into the clock input of the first ferroelectric flip-flop of the plurality of cascaded ferroelectric flip-flops and the output of each of the ferroelectric flip-flops, except for the last, is in each case also connected to the clock input of the ferroelectric flip-flop connected downstream.

What is thus involved in this case is a customary counter circuit arrangement of flip-flops in which, however, ferroelectric flip-flops are used instead of the conventionally used flip-flops.

The invention is also directed at a method for storing information contained in information signals. With regard to the advantages, effects and actions of the method, the statements made above are hereby incorporated by reference in their entirety.

The invention is also directed at a method for storing information represented by at least one information signal or information obtained through evaluation of the at least one information signal in at least one ferroelectric flip-flop in a signal processing means, having the following steps:

A: generating at least one switch-on control signal from an information signal that has arrived, and generating a voltage supply from energy contained in the at least one information signal;

B: activating the signal processing means by the switch-on control signal and applying the voltage supply to the signal processing means;

C: storing an information item represented by the at least one information signal and/or evaluating an information item represented by the at least one information signal and storing the secondary information obtained through the evaluation by means of at least one ferroelectric flip-flop;

D: generating a switch-off control signal after a predetermined time has elapsed after the at least one information signal arrives and/or when the energy converted from the at least one information signal is exhausted; and E: deactivating the signal processing means by the switch-off control signal.

Therefore, in the case of the method according to the invention, too, two possibilities are available for determining the instant at which a switch-off control signal is generated, namely, on the one hand, once again the simple measurement of a time that has elapsed after the arrival of an information signal, and, on the other hand, the measurement of the energy that is still available and has been obtained from the information signal. This last can be determined, for example, by means of a voltage drop. In this case, too, it is understood that, in the event of the successive arrival of a plurality of information signals, it is desirable for the method not to have the result that, independently of the arrival of further information signals, in a manner governed by the switch-off, these can no longer be detected. Rather, care should be taken in this case, too, to ensure that the time that has elapsed since the last information signal that arrived is measured in each case and that the time measurement starts anew when a new information signal arrives.

In the sense of the method according to the invention, deactivation of the signal processing means is in this case to be understood to mean that the switching-logic states contained in the ferroelectric flip-flops are written back to the ferroelectric capacitors in a controlled manner in order to have the content reliably stored in the event of the final disconnection of the voltage supply.

Step B of the method according to the invention may preferably have the following sub-steps:

B1: activating precharge transistors of the at least one ferroelectric flip-flop by applying a voltage;

B2: deactivating the precharge transistors of the at least one ferroelectric flip-flop by disconnecting the voltage;

B3: applying a voltage to ferroelectric capacitors of the at least one ferroelectric flip-flop for transferring the information stored in the ferroelectric capacitors to logic gates of the at least one ferroelectric flip-flop; and B4: activating the voltage supply of the logic gates of the at least one ferroelectric flip-flop.

By this sequence of signals which are based on voltage changes, a reliable transfer of the information already stored beforehand to the logic gates of the ferroelectric flip-flop is achieved.

It is also the case in the context of the disconnection of the signal processing means that a specific order of steps is preferably adhered to. Therefore, step E may preferably have the following sub-steps:

E1: disconnecting a voltage present across ferroelectric capacitors of the at least one ferroelectric flip-flop;

E2: deactivating the voltage supply of the logic gates of the at least one ferroelectric flip-flop;

E3: activating precharge transistors of the at least one ferroelectric flip-flop by applying a voltage; and E4: deactivating the precharge transistors of the at least one ferroelectric flip-flop by disconnecting the voltage.

By virtue of these steps, the opposite process is carried out, in which the levels present at the logic gates are written back to the ferroelectric capacitors as information to be stored.

Preferably, the electronic circuit contains a plurality of ferroelectric flip-flops, wherein the evaluation in step C comprises a summation of the value represented by the information signal and a value already stored in the ferroelectric flip-flops.

Preferably, the summation is effected by means of a counting operation in which the plurality of ferroelectric flip-flops are cascaded in a counter arrangement and an arriving information signal increments or decrements a counter reading of the counter arrangement by the value 1.

Such incrementing or decrementing by the value 1 is appropriate, of course, only if there is merely one input for an information signal. If it is possible for a plurality of information signals to arrive simultaneously or successively via different inputs, the value must be incremented or decremented accordingly.

By way of example, the information stored in the at least one ferroelectric flip-flop can be converted into at least one output signal and be output from the electronic circuit. This additional method step ensures that the information obtained through the information signals can also actually be made available to a user.

The invention is likewise directed at the use of ferroelectric flip-flops. With regard to the effects, advantages and actions of such a use, the statements made above are hereby incorporated by reference in their entirety.

The invention is accordingly directed at the use of ferroelectric flip-flops for electronic circuits, wherein the electronic circuit can detect and/or evaluate information signals and results of the detection and/or evaluation can be stored in at least one ferroelectric flip-flop, this use being characterized in that the entire energy required for the detection, processing and storage can be generated from the information signal.

In this case, the evaluation may comprise counting the arriving information signals. In this case, the electronic circuit can count up or count down the arriving information signals.

Particular preference is attached to a use which is characterized in that the electronic circuit is used in a liquid counter. In the present invention, a liquid counter is understood to be a device which is able to determine the flow of a liquid thorough a cross section, for example a pipe or a channel, and to add up the total quantity of liquid which has flowed through the cross section starting from a start instant. Liquid counters often have to remain at the installation site for long periods of time without being able to be provided with an external power supply. Thus, this is a particularly interesting application example for the present invention, since previous electrical liquid counters require batteries to be exchanged.

Accordingly, the invention is finally also directed at a liquid counter for determining the flow of liquids through a system, having: a sensor which can generate or generates information signals depending on a quantity of liquid flowing through the system; and an electronic circuit which is constructed according to the invention and serves for counting the information signals generated by the sensor; wherein the information signals are the sole energy source for the electronic circuit.

The invention will be explained below using general exemplary embodiments and be illustrated in detail, reference being made to the accompanying drawings, in which the following is illustrated.

Figure 1:
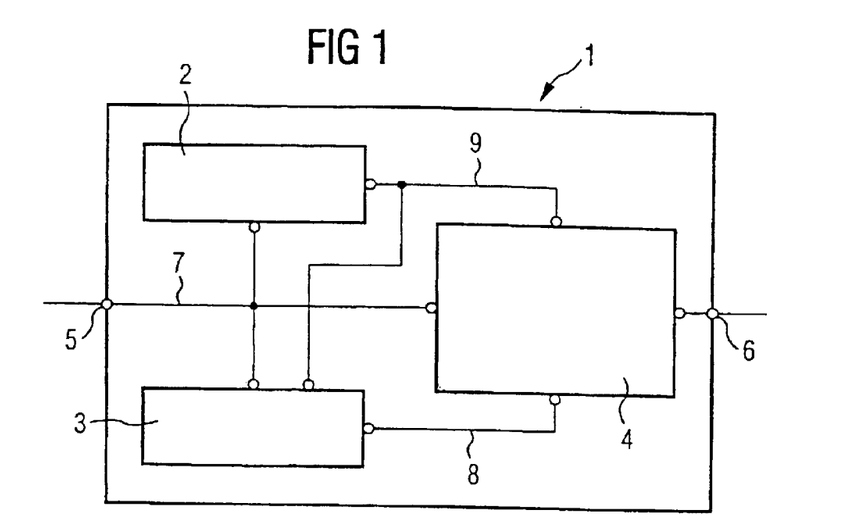
FIG. 1 shows a diagrammatic illustration of an embodiment of the electronic circuit according to the present invention.

FIG. 1 shows the diagrammatic illustration of a possible embodiment of an electronic circuit according to the present invention. The electronic circuit 1 firstly has an input 5, via which an information signal can pass into the electronic circuit 1 by means of a signal line. The information signal is fed to the various functional units on a signal distributor 7. An energy means 2 receives the information signal in order to be able to generate from it a voltage supply, if appropriate even with a plurality of different voltages, depending on the requirements of the electronic circuit 1.

A control means 3 likewise receives the information signal in order thus to be put in the position of being able to produce control signals or at least one control signal in a temporally controlled sequence.

The voltages used for the voltage supply and the various control signals are dimensioned according to the type of circuit layout used and the components used, but likewise according to the voltage of the arriving information signals. The latter is typically determined from the voltage generated by a sensor or something similar which generates the information signals.

Whereas energy means 2 and control means 3 are illustrated as separate units in the illustration in FIG. 1, it is equally possible to combine both means to form a functional and operative unit. In actual tact, for reasons of simplification and saving costs, in practice, often just a single circuit will be used which is able both to generate a voltage supply and to generate suitable control signals.

The voltage supply made available by the energy means 2 is fed via the voltage supply bus 9 both to the control means 3 and to the signal processing means 4. The latter furthermore receives the information signal via the signal distributor 7 and, when an information signal arrives, likewise the control signal via at least one control signal line or a control signal bus 8. Thus, the basic principle of the circuit according to the invention is that the information signal which has arrived at the input 5 is split and fed to different uses. On the one hand, part of the energy contained therein is used for a voltage supply; on the other hand, the instant of arrival is also used in order to make available control signals for activation and deactivation of the actual evaluation unit, and, finally, the information signal is fed to the actual signal processing unit, where it is either only stored or evaluated and is then stored in the ferroelectric flip-flops for example in the event of a power failure or after time has elapsed. The signal processing means 4 can make available a wide variety of types of processing or evaluation of information signals. Typical applications encompass a wide variety of types of counters, such as, for example, asynchronous or synchronous binary counters, counters with a switchable counting device, counters with up and down input, BCD counters and preselection counters and also shift registers. Other circuit logic arrangements can also be realized, for example those in which more than one information signal arrives at the same time and in which logical combinations are produced between the information signals, whose result can finally be stored in a ferroelectric flip-flop, even in the event of a power failure.

A prerequisite for the operation of the electronic circuit 1 according to the invention is that the information signals arriving at the input 6 have a sufficient energy content to be able to supply the electronic circuit 1 with energy. Such quantities of energy, which are of the order of magnitude of between 10 and 100 nJ, are supplied for example by active converters such as, for example, inductive or piezoelectric sensors. Since there is thus sufficient energy available, an additional voltage supply is no longer required at least for the actual counting operation.

FIG. 1 likewise illustrates a signal output by means of which the information stored in the ferroelectric flip-flops or, in the event of lengthy operation, the information that is in each case currently present at the logic gates in the ferroelectric flip-flops can be read out. In the simplest case, this is a single signal line which is routed out at the output 6. If only a binary representation, that is to say 1 or 0 is stored as information in the ferroelectric flip-flops, it suffices simply to read out the latter. However, if a plurality of bit information items are buffer-stored in the signal-processing means 4 by means of a plurality of ferroelectric flip-flops, it may be necessary either to route a plurality of signal lines toward the outside, which simultaneously pass the outputs of the various ferroelectric flip-flops toward the outside, or to provide an additional circuit which, in a temporal sequence, can output the individual bits of the various ferroelectric flip-flops successively via the output 6.

Figure 2:
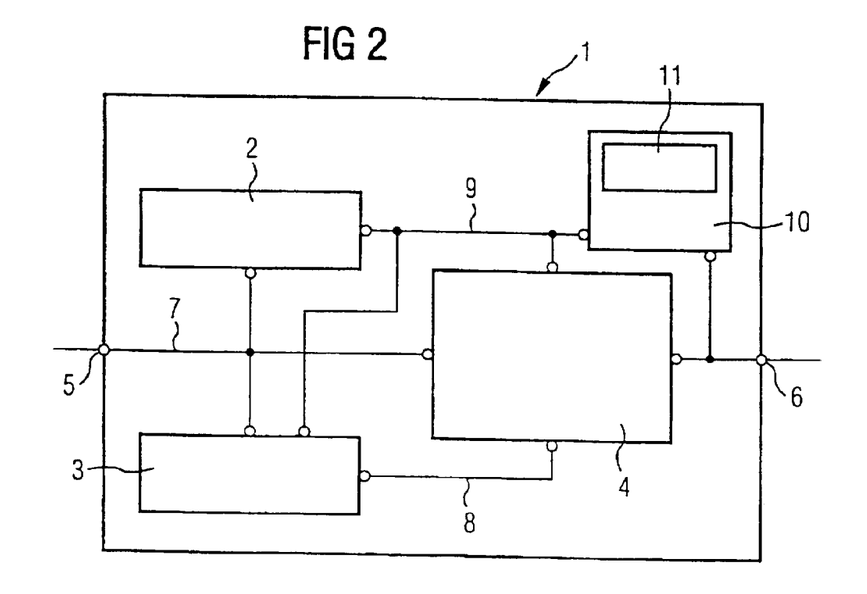
FIG. 2 shows a further embodiment of an electronic circuit according to the present invention, in which a display unit is additionally provided.

FIG. 2 shows a modification of a further exemplary embodiment of an electronic circuit according to the present invention, in which, in comparison with FIG. 1, a display means 10 with an LCD display 11, for example, has also been added. In the exemplary embodiment illustrated in FIG. 2, the display means 10 is likewise supplied with energy by the voltage supply bus 9 and the information stored in the ferroelectric flip-flops of the signal processing means is likewise output to the display means 10. In this case, the display means 10 can either be connected directly to the outputs of the ferroelectric flip-flops or, as illustrated in FIG. 2, being concomitantly served by the same output signal line which also supplies information at the output 6.

The ferroelectric flip-flops used in the electronic circuit according to the invention and in the method according to the invention will be described in more detail below.

Figure 3:
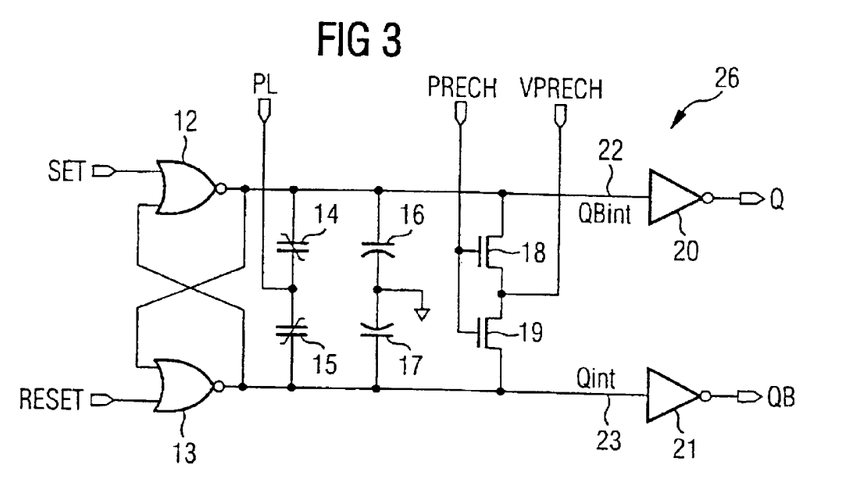
FIG. 3 shows a ferroelectric flip-flop which is used in the following invention, with only NOR gates.

FIG. 3 shows a diagrammatic illustration of a ferroelectric flip-flop. The latter has the elements that are known in conventional flip-flops, in particular two logic gates, in this case NOR gates 12,13, which can be driven in each case via an input SET and RESET, respectively, and also two inverters 20,21, which are connected to the NOR gates 12,13 via internal data lines QBint 22 and Qint 23 and can output the inverted results of the logic gates via the outputs Q and QB, respectively. Over and above this known construction, however, ferroelectric flip-flops have further specific elements. The latter are, firstly, the characteristic ferroelectric capacitors 14,15, which can be supplied with voltage via a line PL. In addition there are the precharge transistors 18,19, which can be activated via the line PRECH and can be supplied with voltage via the line VPRECH. The further capacitances 16,17 may optionally be provided. The NOR gates of the two circuits are designed symmetrically, so that the state assumed upon switch-on depends on the charge on the networks Qint23 and QBint 22, if the inputs SET and RESET are not active at this point in time. The charge on the networks Qint23 and QBint 22 is read from the ferro-capacitors 14,15 before the switch-on of the logic gates and corresponds to the last state assumed by the flip-flop before the last switch-off. The read-out from the ferroelectric capacitors is effected according to the scheme outlined below.

Firstly, the internal data lines 22,23 are precharged to a specific voltage VPRECH, for example 0 volts, via the precharge transistors 18,19 and the associated control signal PRECH. In order to achieve this, the NOR gates must not yet be supplied with operating voltage. Afterward, the transistors 18,19 are turned off again. As a result, the networks Qint23 and QBint22 are at high impedance.

A signal PL, which until now has been kept at the same potential as VPRECH, is then raised to a specific voltage. Charge equalization is then effected by means of the capacitive voltage dividers produced from the ferroelectric capacitors and the capacitances 16,17 of the networks Qint23 and QBint22. The capacitances 16,17 may either only consist of component input or wiring capacitances or additionally be increased by capacitances that are actually realized. In order to ensure that the value of these capacitances is independent of the circuitry at the output of the ferroelectric flip-flops, the internal data lines Qint23 and QBint22 are decoupled from the actual outputs of the circuit Q and QB by two inverters 20,21. However, if the switching mechanism in which the ferroelectric flip-flop is used is known, the output inverters can possibly be omitted. Depending on the stored state of the ferroelectric capacitors, the potential of one internal data line (Qint23 or QBint22) after the charge equalization is now greater than the potential of the other data lines. The potential of the input PL can now either be kept at the higher potential or be reduced to VPRECH again.

The voltage supply of the NOR gates is now switched on, so that the flip-flop latches to one of the two possible states, depending on what voltages are present on the internal data lines Qint23 and QBint22. What is important in this case is that the inputs of the NOR gates are furthermore not active, that is to say that SET and RESET must be at logic LOW. After the switch-on and switch-off of this operation, the ferroelectric flip-flops can be operated like customary flip-flops.

Figure 4:
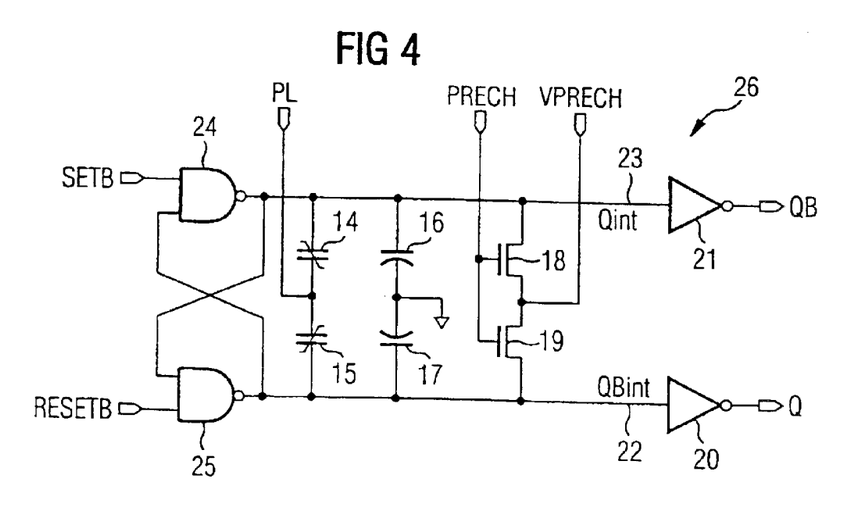
FIG. 4 shows a further ferroelectric flip-flop which can be used in the invention, with NAND gates.

FIG. 4 shows a further ferroelectric flip-flop for use in the present invention, which corresponds to the flip-flop shown in FIG. 3, but NAND gates 24,25 are used instead of the NOR gates 12,13. The internal data lines are correspondingly changed.

Figure 5:
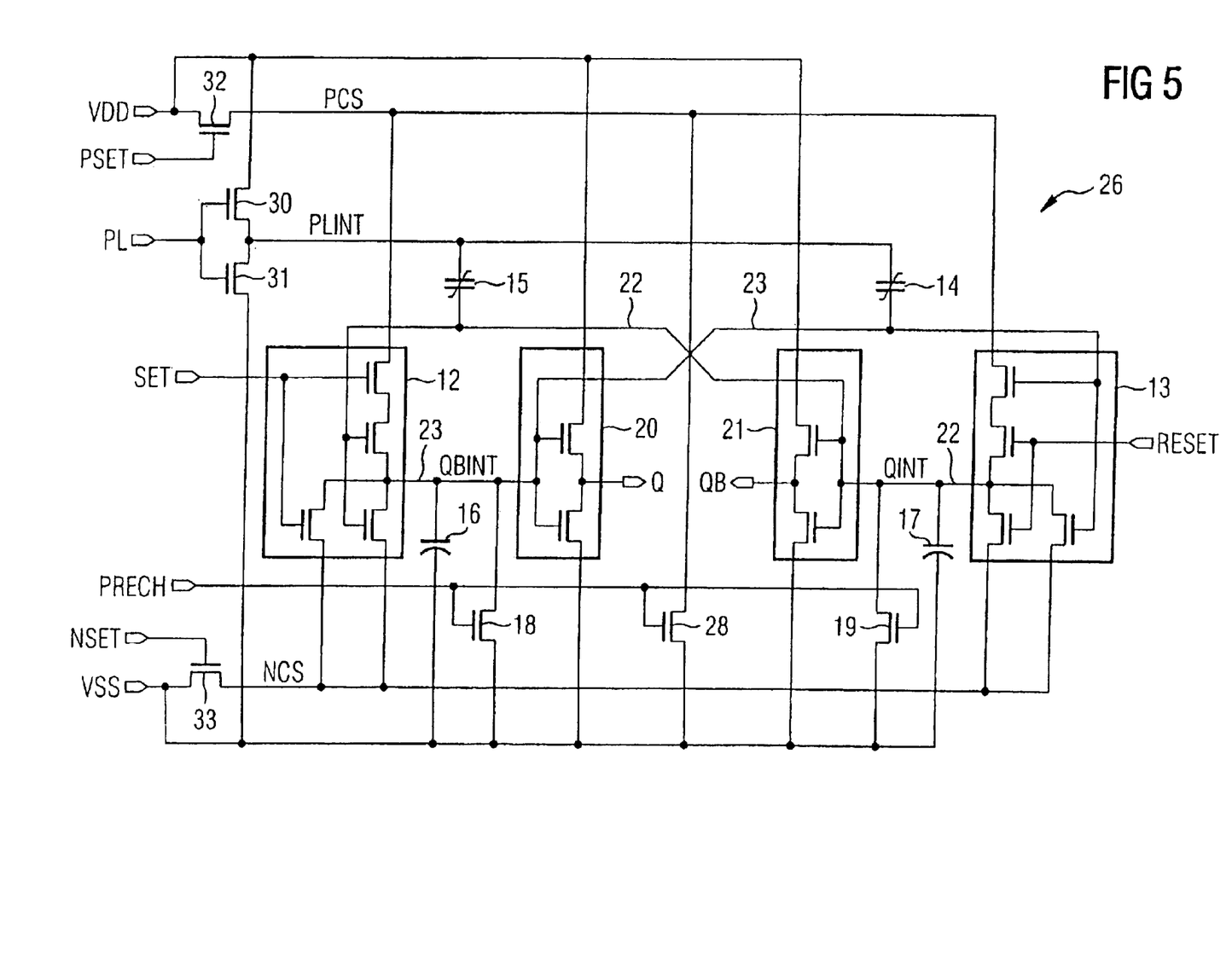
FIG. 5 shows a less abstract circuit diagram of the ferroelectric flip-flop illustrated in FIG. 3, for use in the present invention.

In an illustration which is configured more concretely but is still slightly diagrammatic, FIG. 5 shows a more concrete embodiment of the ferroelectric flip-flop shown generally in FIG. 3 for use with the present invention. The two NOR gates 12,13 and the two inverters 20,21 are in this case depicted with their transistors that are used in each case.

The text below describes how the ferroelectric flip-flop illustrated in FIG. 5 is made ready for operation. Firstly, the two precharge transistors 18,19 are activated by means of the signal PRECH. Afterward, the voltage supply VDD is raised to a suitable value, for example 3 volts. The precharge transistors 18,19 are then turned up and the voltage at the input PL is increased to a value corresponding to VDD, for example 3 volts, so that the two transfer switching transistors 30,31 are activated, which causes the information contained in the ferroelectric capacitors 14,15 to be transferred onto the internal data lines 22,23. At this point in time, then, the ferroelectric capacitors and the inverters are supplied with current. Only afterward is the supply voltage of the two NOR gates 12,13 switched on by the signals NSET and PSET being raised to the voltage used, for example 3 volts, which causes the two logic switching transistors 32,33 to be activated and a voltage between VDD and VSS then to be present at the transistors.

FIG. 5 furthermore shows a transistor for the logic gates 28, which pulls the positive voltage supply of the NOR gates 12,13 to a fixed potential VSS if a voltage is applied at the signal PRECH.

The ferroelectric flip-flop shown in FIG. 5 is deactivated in the reverse order. Firstly, the signal PL is turned off. The voltage supply of the NOR gates 12,13 is then disconnected by turning off NSET. Afterward, the precharge transistors 18,19 are activated by a signal at PRECH, in order to avoid interference pulses on the ferroelectric capacitors. Finally, the supply voltage as such is disconnected and lastly the signal PRECH of the precharge transistors 18,19.

The ferroelectric flip-flops outlined above can be used in manifold ways in the electronic circuits according to the present invention and in the method of the present invention. The text below will describe a concrete application which realizes a counter comprising a plurality of cascaded ferroelectric flip-flops. It is under stood, however, that other circuit arrangements can also be realized in the context of the present invention, for example ones in which a plurality of arriving information signals can be simultaneously combined with one another in a specific manner.

Figure 6:
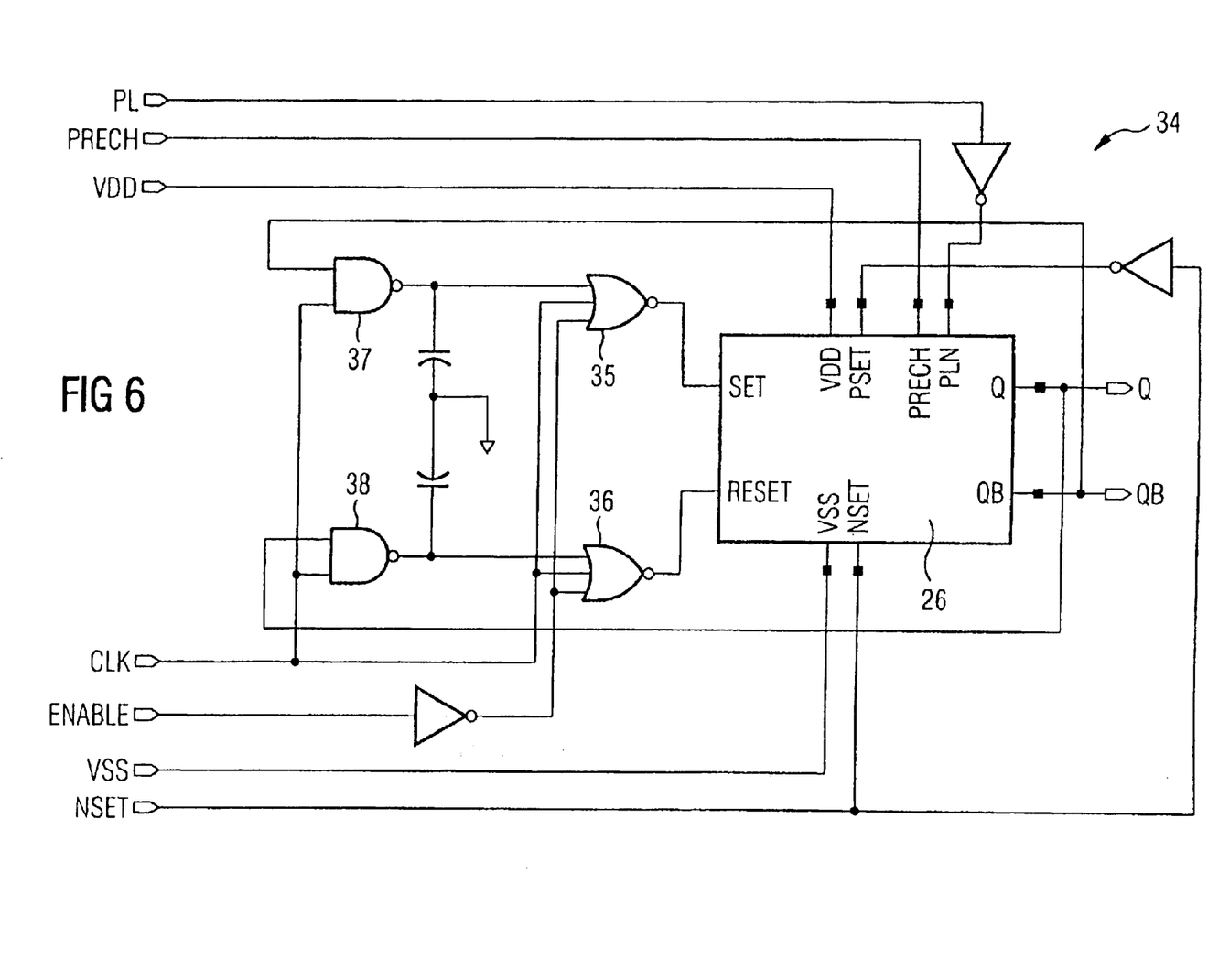
FIG. 6 shows a ferroelectric flip-flop which is edge-controlled by additional logic gates and forms a divider.

FIG. 6 firstly shows how a ferroelectric flip-flop 26, as illustrated in FIG. 5, is provided with an additional logic circuit in order to make it into an edge-controlled flip-flop which simultaneously fulfils a dividing function, that is to say changes the state at one of the outputs Q,QB upon every falling edge of an information signal. The circuit 34 represents a dividing unit which, however, simultaneously represents a special instance of a flip-flop, as is known to the person skilled in the art.

Two NOR gates 35,36 and two NAND gates 37,38 are in each case connected to an input for the information signal, said input being designated by CLK. The designation CLK therefore shows that what is involved in this case is also a clock-controllable flip-flop in which a clock signal (CLOCK) can then be applied to this input. The two inputs NSET and PSET of the ferroelectric flip-flop 26, which are already known from FIG. 5, are combined by means of an inverter in the circuit arrangement of FIG. 6, so that both are driven by a common input signal, which is again designated as NSET. A further input ENABLE is provided in the circuit arrangement of FIG. 6, which input must be activated in order that an information signal arriving at the input CLK is forwarded by the NOR gates 35,36 to the inputs SET and RESET, respectively, of the ferroelectric flip-flop 26.

Figure 7:
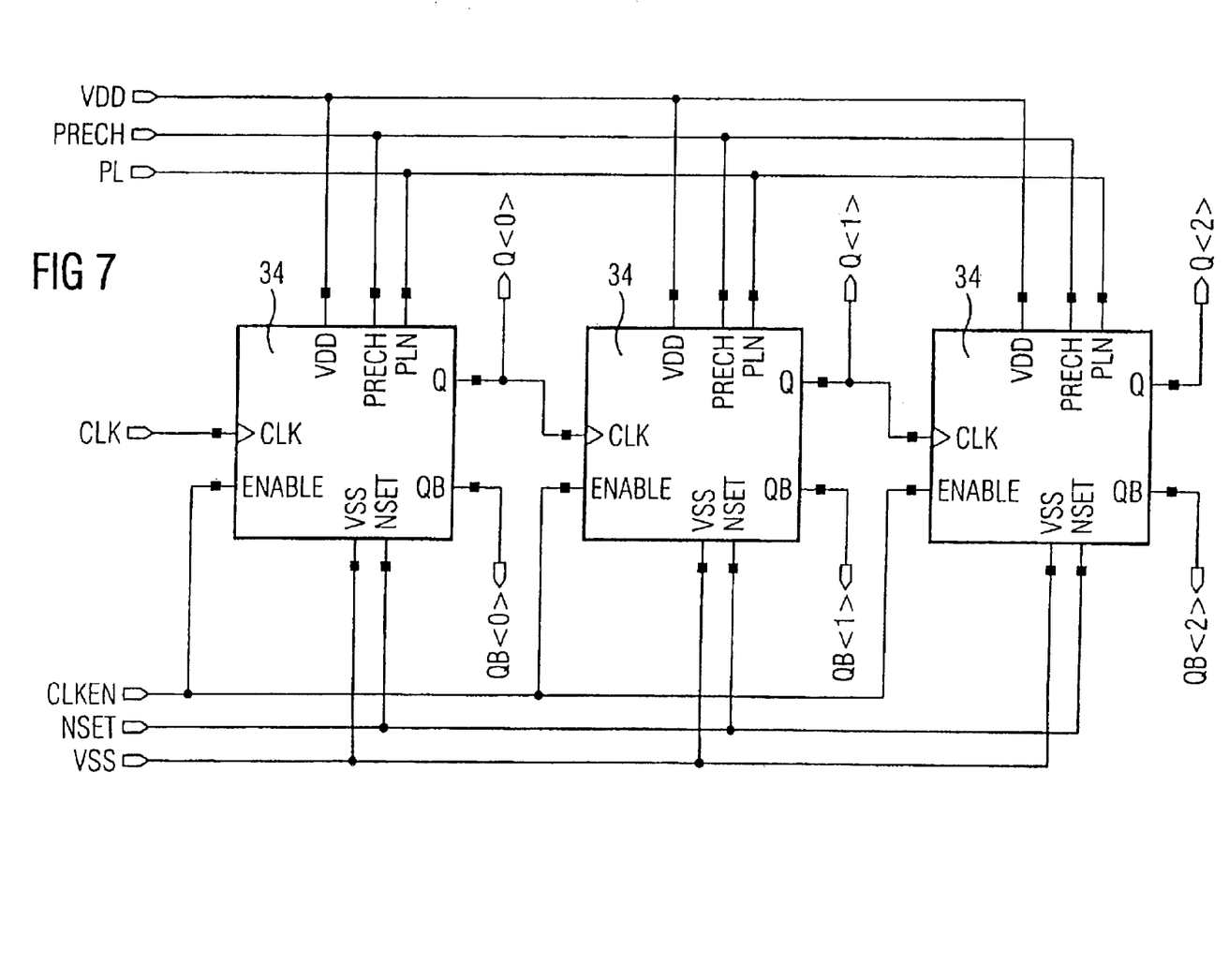
FIG. 7 shows a counter circuit with the edge-controlled flip-flops shown in FIG. 6.

Finally, FIG. 7 shows the integration of a plurality of these dividing devices 34 in a counter arrangement. As can be discerned here, the information signal arriving via the input CLK is fed only to the first dividing circuit 34 in the sequence of dividing circuits. The output Q of the ferroelectric flip-flop is passed on to the input CLK of the next ferroelectric flip-flop or of the next dividing unit 34. The lines for the control signals PRECH, PL, NSET and, finally, the ENABLE added in FIG. 6 (input is CLKEN here) correspond to FIGS. 5 and 6.

The state of the first edge-controlled ferroelectric flip-flop 34 changes in each case with the edge of an information signal arriving at CLK. The same occurs with the second edge-controlled ferroelectric flip-flop 34 in the arrangement, which receives signals from the output Q of the first edge-controlled ferroelectric flip-flop at the input CLK. This means that the state of the output Q at the second edge-controlled ferroelectric flip-flop 34 changes only for every second information signal. Consequently, a counting circuit is implemented in which the left-hand edge-controlled ferroelectric flip-flop represents the less significant bit; the one furthest on the right represents the most significant bit. In this case, the number of cascaded flip-flops determines the maximum number of arriving information signals. With eight cascaded ferroelectric flip-flops 34, it is possible, for example, to represent the range of decimal numbers between 0 and 255 (corresponding to 0000 0000 to 1111 1111 binary).

Figure 8A:
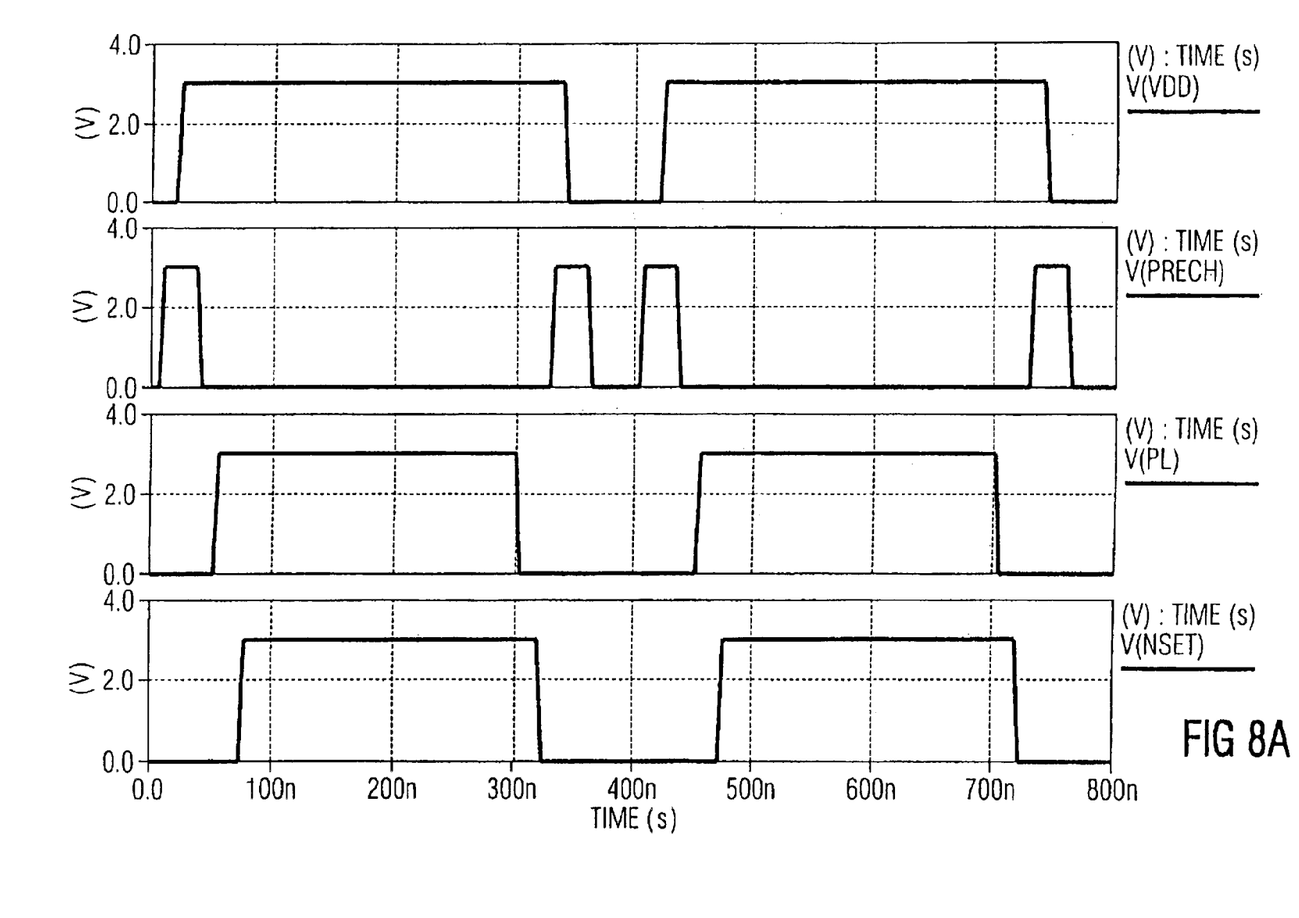
FIGS. 8A and 8B show an exemplary temporal progression of the control and information signals and of the voltage supply in the case of an electronic circuit according to the invention.
Figure 8B:
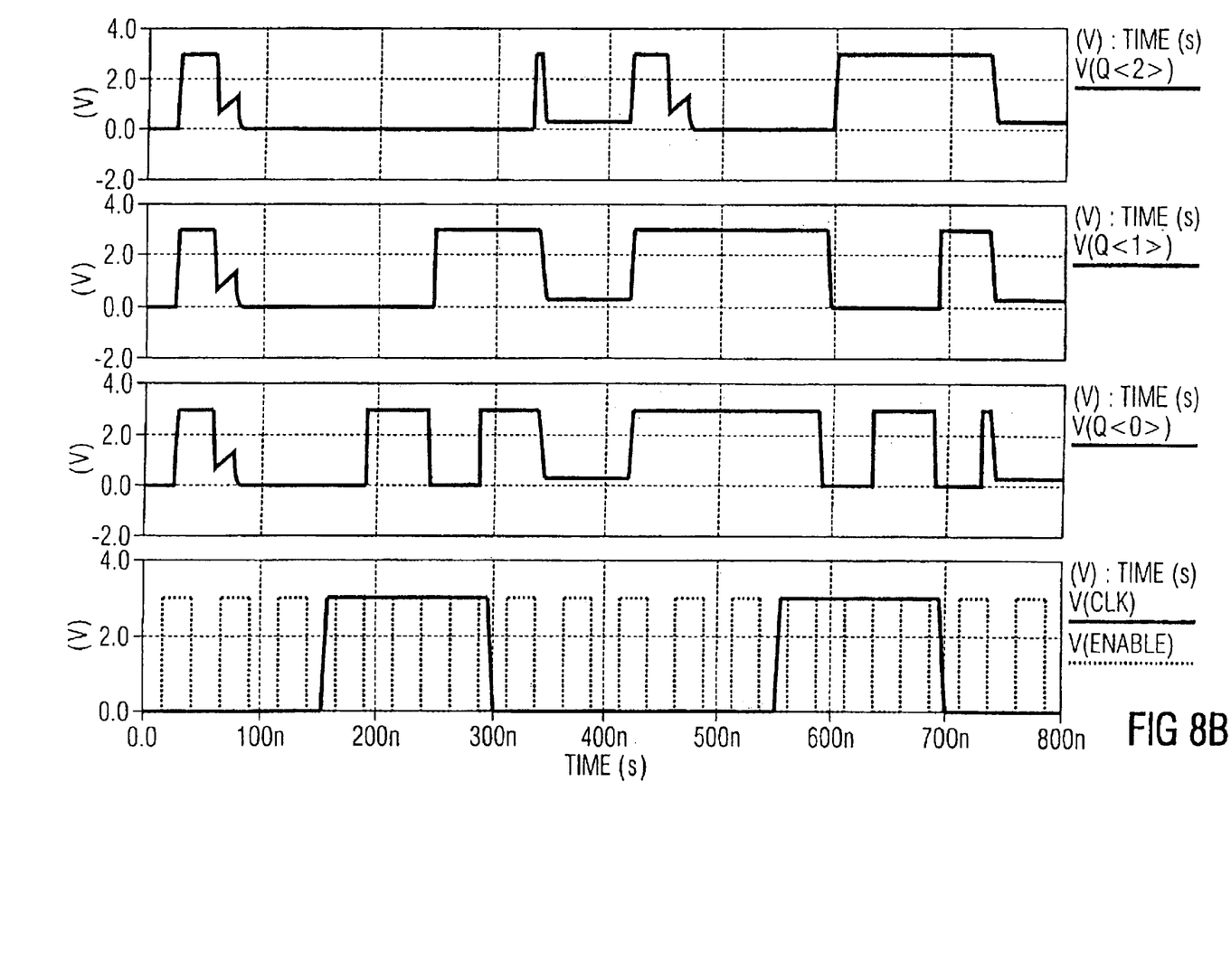

The temporal sequence of a counting operation by the circuit shown in FIG. 7 will now be clarified with reference to the graphics in FIG. 8. The graphics show two signal acquisition cycles that proceed one after the other. FIG. 8 shows the temporal profile of the voltages present at various inputs and outputs of the circuit in their temporal profile. The time sequence in ns is represented on the abscissa, while the voltages of the signals that are respectively present are represented on the various ordinates. By being arranged one below the other it is possible to assess the temporal sequence of the signals relative to one another.

As explained above, firstly the voltage is applied to the input PRECH in order to activate the precharge transistors 18,19. The signal PRECH is formed by the control means 3. Immediately afterward, the operating voltage VDD is applied to the entire system. This voltage is generated by the energy means 2. As illustrated in FIG. 8B, this has the result that a voltage is likewise at the respective outputs Q0 to 2 of the three ferroelectric flip-flops 34 shown by way of example here. Immediately after the operating voltage VDD has been switched on, the voltage at the input PRECH is disconnected.

The control means 3 then generates a voltage at the input PL of the ferroelectric flip-flops, which leads to the deactivation of the transfer switching transistors 30,31 and thus to the transferring of the information stored in the ferroelectric capacitors 14,15 onto the internal data lines 22,23. As shown in FIG. 8B, at this instant the outputs of the three ferroelectric flip-flops shown by way of example assume the defined level states, that is to say 0 in this case, since as yet no information is stored in the ferroelectric flip-flops 26. Afterward, the control means 3 generates a voltage at the input NSET (and also at the input PSET in some embodiments), which leads to the activation of the logic switching transistors 33 (and possibly 32), with the result that the operating voltage of the NOR gates 12,13, or of the NAND gates 24,25 if NAND gates are used, is switched on.

In the present experimental application of an electronic circuit according to the invention, no individually arriving information signals are used. Rather, as shown in FIG. 8B, bottom line, a clock signal is generated, which is applied to the input CLK. The ferroelectric flip-flops or dividers 34 (see FIG. 6) used in FIG. 7 have an additional input which is required in order to enable a transfer of the information signal present at the input CLK to the inputs of the ferroelectric flip-flop 26, namely the input ENABLE. Only after the control means 3 applies a voltage to the input ENABLE (see FIG. 8B, bottom, solid signal line) does the occurrence of the information signals applied to the input CLK lead to a reaction at the outputs of the ferroelectric flip-flops or dividers 34. With the falling edge of the first information signal arriving after the switch-on of the ENABLE input, the output signal changes from level 0 to level Logic 1 at the output of the first of the cascaded ferroelectric flip-flops. After the fall of the second arriving information signal, the level changes to Logic 0 again, whereupon the level at the output of the ferroelectric flip-flop connected downstream goes to Logic 1. In the temporal progression of the experiment, a turn-off operation is then simulated, as would be effected, in an electronic circuit according to the invention, by the control means after a specific time has elapsed after the arrival of a last information signal or in the event of the expected fall in the voltage supply on account of energy deficiency.

This fall is only simulated in the case of the experiment shown, since the clock signal continues to be present at the input CLK.

In order to deactivate the ferroelectric flip-flops according to the invention, firstly the ENABLE and PL signals are turned off. Afterward, the voltage supply of the logic gates is disconnected by turning off the signal NSET. What is achieved as a result is that the information contained in the three ferroelectric flip-flops is correctly written back to the ferroelectric capacitors. The precharge transistors 18,19 are then momentarily activated, the entire voltage supply is disconnected and, finally, the precharge transistors are deactivated.

Afterward, a further signal acquisition cycle is initiated in the experiment. The sequence corresponds to the above-described first activation of the electronic circuit. As shown in FIG. 8B, however, the information of the individual ferroelectric flip-flops which is stored in the ferroelectric capacitors 14,15 is written back to the logic gates, so that a level of Logic 1 is established in accordance with the state prior to the last disconnection at the outputs of the first and second of the series of ferroelectric flip-flops. The information represented by the three ferroelectric flip-flops thus corresponds to the binary value 011, that is to say a decimal numerical value of 3. After the ENABLE signal has in turn been switched on, three information signals are then again counted, so that, at the end of this information signal acquisition phase, the three ferroelectric flip-flops contain the binary value 110 (corresponding to the decimal numerical value 6). Finally, FIG. 8 shows yet another deactivation sequence, which again has the result that said information present at the outputs of the ferroelectric flip-flops 26 is transferred into the respective ferroelectric capacitors 14,15.

The experimental signal acquisition operation shown in FIG. 8 was able to show that it is actually possible with the electronic circuit according to the invention to buffer-store the information contained in the ferroelectric flip-flops and to re-establish it upon the reoccurrence of signals or of voltage.

What is claimed is:

1. An electronic circuit having
   an input for inputting at least one information signal;
   an energy means for converting energy contained in the at least one information signal into a voltage supply;
   a control means for generating at least one switch-on control signal when an information signal arrives; and
   a signal processing means for storing an information item represented by the at least one information signal and/or for evaluating an information item represented by the at least one information signal and storing the secondary information obtained through the evaluation by means of at least one ferroelectric flip-flop;
   wherein the signal processing means can be activated by the at least one switch-on control signal for the purpose of evaluation and/or storage;
   and wherein, during the evaluation and/or storage, the at least one information signal may be the sole energy source for the electronic circuit;
   wherein the at least one switch-on control signal has the following signals;
   an activation signal for activating precharge transistors of the at least one ferroelectric flip-flop;
   transfer signal for transferring the information contained in ferroelectric capacitors of the at least one ferroelectric flip-flop onto internal data lines of the at least one ferroelectric flip-flop; and
   a current switching signal for switching on the voltage supply of the signal processing means.

2. The electronic circuit as claimed in claim 1, wherein the control means can generate at least one switch-off control signal after a predetermined time has elapsed after the at least one information signal arise and when the energy converted from the at least one information signal is exhausted,
   wherein the signal processing means can be caused or is caused to effect a storage and to effect deactivation by the at least one switch-off control signal.

3. The electronic circuit as claimed in claim 1 or 2, wherein the information stored in the at least one ferroelectric flip-flop can be converted into at least one output signal by the signal processing means and the electronic circuit furthermore has at least one output for outputting the at least one output signal.

4. The electronic circuit as claimed in claim 1, wherein the electronic circuit furthermore has a display means for displaying the information stored in the at least one ferroelectric flip-flop.

5. The electronic circuit as claimed in claim 4, wherein the display means is concomitantly supplied by the voltage supply generated by the energy means.

6. The electronic circuit as claimed in claim 4 or 5, or wherein the display means has an LCD display.

7. The electronic circuit as claimed in claim 3, wherein an external voltage supply and external control means can be connected for the outputting of the information stored in the at least one ferroelectric flip-flop by the signal processing means.

8. The electronic circuit as claimed In claim 2, wherein the at least one switch-off control signal has the following signals:
   a transfer end signal;
   an activation signal for activating precharge transistors of at least one ferroelectric flip-flop; and
   a current switch-off signal for switching off the voltage supply of the signal processing means.

9. The electronic circuit as claimed in claim 1, wherein signal lines for each of the switch-on signals lead from the control means to the signal processing means.

10. The electronic circuit as claimed in claim 8 or 9, wherein signal lines for each of the switch-off signals lead from the control means to the signal processing means.

11. The electronic circuit as claimed in claim 10, wherein, for the transfer signal and the transfer end signal, a common transfer signal line leads from the control means to the signal processing means, the transfer signal consists in the application of a voltage to the common transfer signal line and the transfer end signal consists in the disconnection of the voltage on the common transfer signal line.

12. The electronic circuit as claimed in claim 10, wherein, for the current switching signal and the current switch-off signal, a common current signal line leads from the control means to the signal processing means, the current switching signal consists in the application of a voltage to the common current signal line and the current switch-off signal consists in the disconnection of the voltage on the common current signal line.

13. The electronic circuit as claimed in claim 1, wherein the signal processing circuit is a counting circuit for evaluating a plurality of information signals, which arrive successively or simultaneously by counting the information signals that have arrived.

14. The electronic circuit as claimed in claim 13, wherein the counting circuit comprises a plurality of cascaded edge-controlled ferroelectric flip-flops, in which the at least one Information signal is input into the clock input of the first ferroelectric flip-flop of the plurality of cascaded ferroelectric flip-flops and the output of each of the ferroelectric flip-flops, except for the last, is in each case also connected to the clock input of the ferro electric flip-flop connected downstream.

15. A method for storing information represented by at least one information signal or information obtained through evaluation of the at least one information signal in at least one ferroelectric flip-flop in a signal processing means, having the following steps:
   A: generating at least one switch-on control signal from an information signal that has arrived, and generating a voltage supply from energy contained In the at least one information signal;
   B: activating the signal processing means by the switch-on control signal and applying the voltage supply to the signal processing means, wherein step B has the sub-steps:
      B1: activating precharge transistors of the at least one ferroelectric flip-flop by applying a voltage;
      B2: deactivating the precharge transistors of the at least one ferroelectric flip-flop by disconnecting the voltage;
      B3: applying a voltage to ferroelectric capacitors of the at least one ferroelectric flip-flop for transferring the information stored in the ferroelectric capacitors to logic gate of the at least one ferroelectric flip-flop; and
      B4: activating the voltage supply of the logic gates of the at least one ferroelectric flip-flop;
   C: storing an information Item represented by the at least one information signal and/or evaluating an information item represented by the at least one information signal and storing the secondary information obtained through the evaluation by means of at least one ferroelectric flip-flop;
   D: generating a switch-off control signal after a predetermined time has elapsed after the at least one information signal arrives and/or when the energy converted from the at least one information signal is exhausted; and E: deactivating the signal processing means by the switch-off control signal.

16. The method as claimed in claim 15, wherein step E has the sub-steps:
   E1: disconnecting a voltage present across ferroelectric capacitors of the at least one ferroelectric flip-flop;
   E2: deactivating the voltage supply of the logic gates of the at least one ferroelectric flip-flop;
   E3: activating precharge transistors of the at least one ferroelectric flip-flop by applying a voltage; and
   E4: deactivating the precharge transistors of the at least one ferroelectric flip-flop by disconnecting the voltage.

17. The method as claimed in one of claim 15 or 16, wherein the electronic circuit contains a plurality of ferroelectric flip-flops and the evaluation comprises a summation of the value represented by the information signal and a value already stored in the ferroelectric flip-flops.

18. The method as claimed in claim 17, wherein the summation is effected by means of a counting operation, in which plurality of ferroelectric flip-flops are cascaded in a counter arrangement and an arriving information signal increments or decrements a counter reading of the counter arrangement by the value 1.

19. The method as claimed in claim 15, wherein the information stored in the at least one ferroelectric flip-flop can be converted into at least one output signal and be output from the electronic circuit.

* * * * *

UNITED STATES PATENT AND TRADEMARK OFFICE
CERTIFICATE OF CORRECTION

PATENT NO. : 6,833,731 B1
DATED : December 21, 2004
INVENTOR(S) : Christl Lauterbach et al.

It is certified that error appears in the above-identified patent and that said Letters Patent is hereby corrected as shown below:

Title page,
Item [30], Foreign Application Priority Data, after "199 40 355" add -- .4 --.

Column 7,
Line 62, "tact" should read -- fact --.

Column 10,
Line 45, "under stood" should read -- understood --.

Column 13,
Line 52, delete "or".

Signed and Sealed this

Seventh Day of February, 2006

JON W. DUDAS
*Director of the United States Patent and Trademark Office*